(12) United States Patent
Staub et al.

(10) Patent No.: US 7,326,985 B2
(45) Date of Patent: Feb. 5, 2008

(54) METHOD FOR FABRICATING METALLIC BIT-LINE CONTACTS

(75) Inventors: Ralf Staub, Dresden (DE); Jürgen Amon, Dresden (DE); Norbert Urbansky, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/692,024

(22) Filed: Oct. 23, 2003

(65) Prior Publication Data

US 2004/0192007 A1 Sep. 30, 2004

Related U.S. Application Data

(63) Continuation of application No. PCT/EP02/04308, filed on Apr. 18, 2002.

(30) Foreign Application Priority Data

Apr. 24, 2001 (DE) ................. 101 98 736

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/301; 257/68; 257/71; 257/303; 257/905; 257/E27.084; 257/E21.646

(58) Field of Classification Search .............. 257/68, 257/71, 301, 303, 905, E27.084, E21.646
See application file for complete search history.

(56) References Cited

U.S. PATENT DOCUMENTS

| | | | | |
|---|---|---|---|---|
| 5,065,215 A | * | 11/1991 | Kubota ................. | 257/208 |
| 5,097,381 A | * | 3/1992 | Vo ....................... | 361/313 |
| 5,395,784 A | | 3/1995 | Lu et al. ............... | 438/52 |
| 5,817,572 A | | 10/1998 | Chiang et al. ......... | 438/624 |
| 5,905,279 A | | 5/1999 | Nitayama et al. | |
| 5,998,251 A | | 12/1999 | Wu et al. .............. | 438/241 |
| 6,001,683 A | | 12/1999 | Lee | |
| 6,054,730 A | * | 4/2000 | Noguchi ................ | 257/306 |
| 6,140,675 A | * | 10/2000 | Sugiura et al. ........ | 257/301 |
| 6,144,050 A | | 11/2000 | Stumborg et al. ..... | 257/213 |
| 6,165,863 A | | 12/2000 | Lee et al. .............. | 438/387 |
| 6,168,984 B1 | | 1/2001 | Yoo et al. .............. | 235/492 |

(Continued)

FOREIGN PATENT DOCUMENTS

DE         28 37 777         3/1980

(Continued)

OTHER PUBLICATIONS

International Search Report issued for PCT/EP02/04308.

(Continued)

*Primary Examiner*—Michelle Estrada
(74) *Attorney, Agent, or Firm*—Patterson & Sheridan, L.L.P.

(57) ABSTRACT

A memory cell and method of forming the same is provided. To make contact between a bit line and a select transistor of a dynamic memory unit on a semiconductor wafer, a contact hole is filled with a metal or a metal alloy. A liner layer may be introduced between the semiconductor substrate and the metal filling. The semiconductor substrate has a doped region in the contact hole.

12 Claims, 16 Drawing Sheets

U.S. PATENT DOCUMENTS

| | | | |
|---|---|---|---|
| 6,218,693 B1 * | 4/2001 | Lu | 257/296 |
| 6,281,540 B1 | 8/2001 | Aoki | |
| 6,284,591 B1 | 9/2001 | Lee | |
| 6,300,683 B1 | 10/2001 | Nagasaka et al. | |
| 6,429,069 B1 * | 8/2002 | Dennison et al. | 438/253 |
| 6,455,368 B2 | 9/2002 | Aoki | |
| 6,583,464 B1 * | 6/2003 | Bertagnolli et al. | 257/306 |
| 6,608,341 B2 * | 8/2003 | Schrems | 257/301 |
| 6,635,915 B2 * | 10/2003 | Kokubun | 257/301 |
| 6,762,136 B1 * | 7/2004 | Bollinger et al. | 438/795 |
| 6,870,263 B1 | 3/2005 | Clevenger et al. | |
| 2001/0041405 A1 | 11/2001 | Aoki | |
| 2002/0195636 A1 * | 12/2002 | Matsubara | 257/301 |
| 2002/0195637 A1 * | 12/2002 | Kokubun | 257/301 |

FOREIGN PATENT DOCUMENTS

| | | |
|---|---|---|
| DE | 40 34 169 A1 | 5/1991 |
| DE | 297 22 440 U1 | 4/1998 |
| DE | 199 52 273 A1 | 9/2002 |
| JP | 07022346 | 1/1995 |
| JP | 09135005 | 5/1997 |
| JP | 10242422 | 9/1998 |
| JP | 11097651 | 4/1999 |
| WO | WO9933104 A1 | 7/1999 |

OTHER PUBLICATIONS

German Patent Office Examination Report dated Nov. 14, 2001.
International Preliminary Examination Report issued for PCT/EP02/04308, dated Jul. 31, 2003.
Translation of the Examination Report dated Sep. 12, 2006 from the Japanese Patent Office.

* cited by examiner

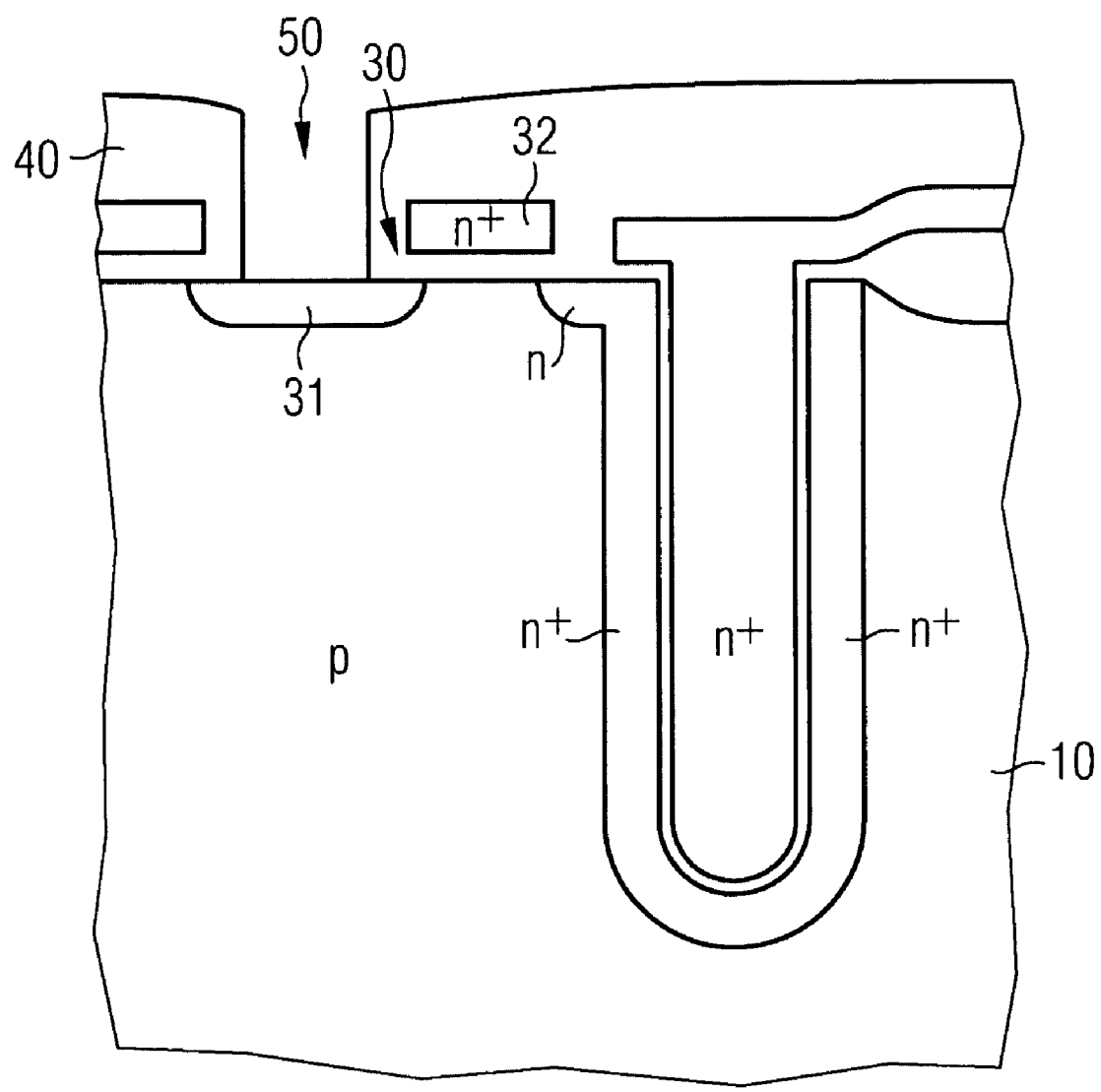

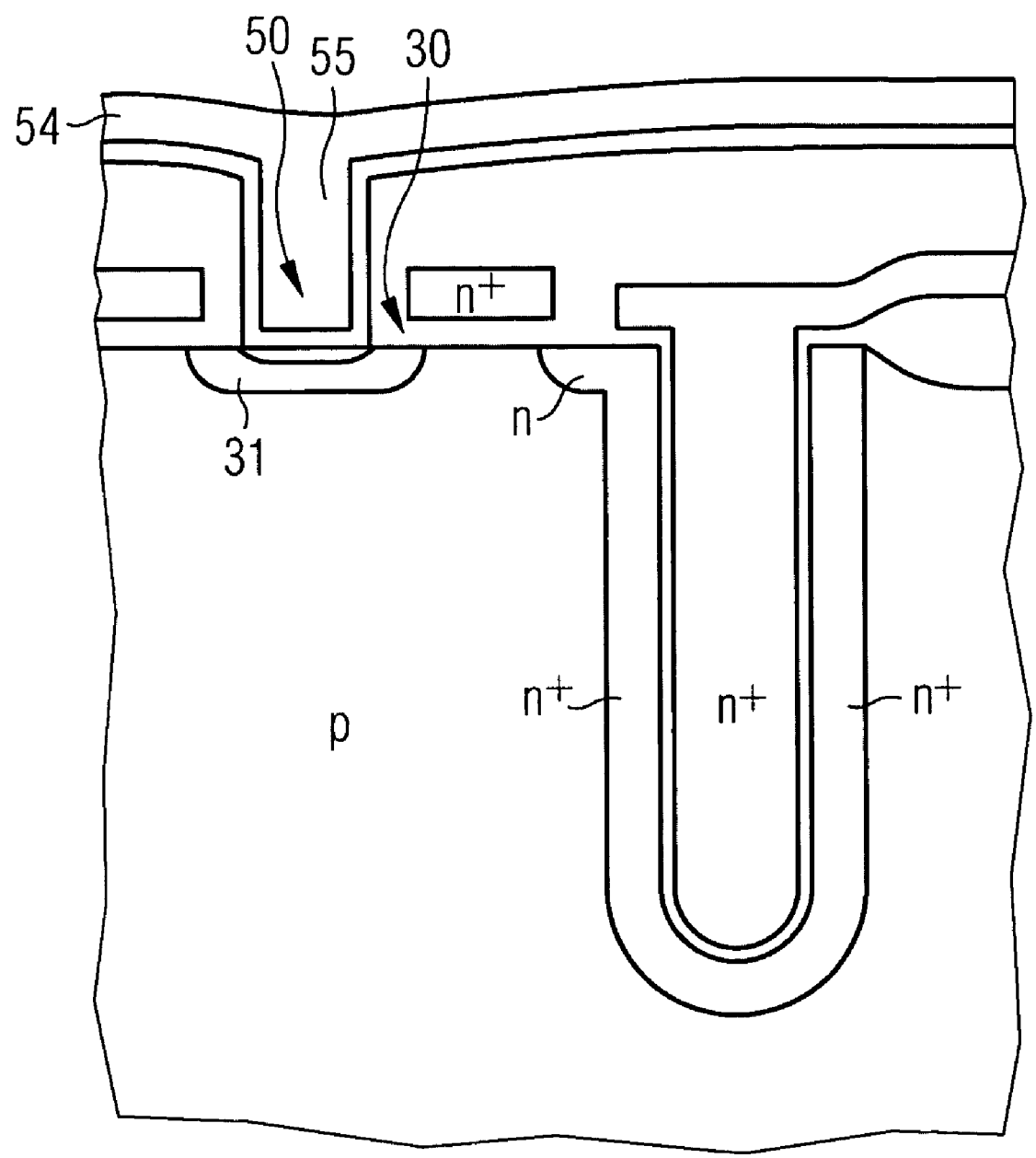

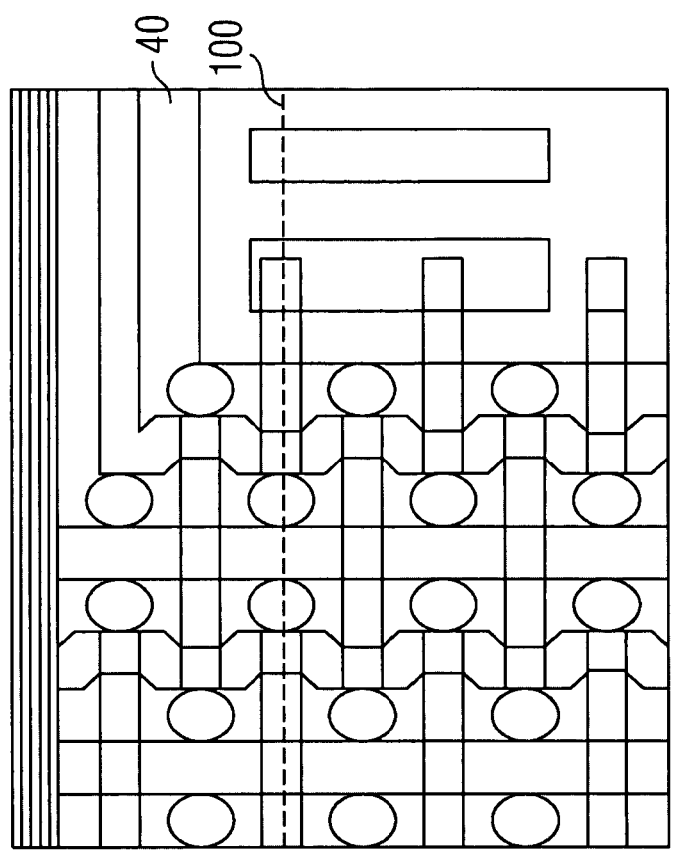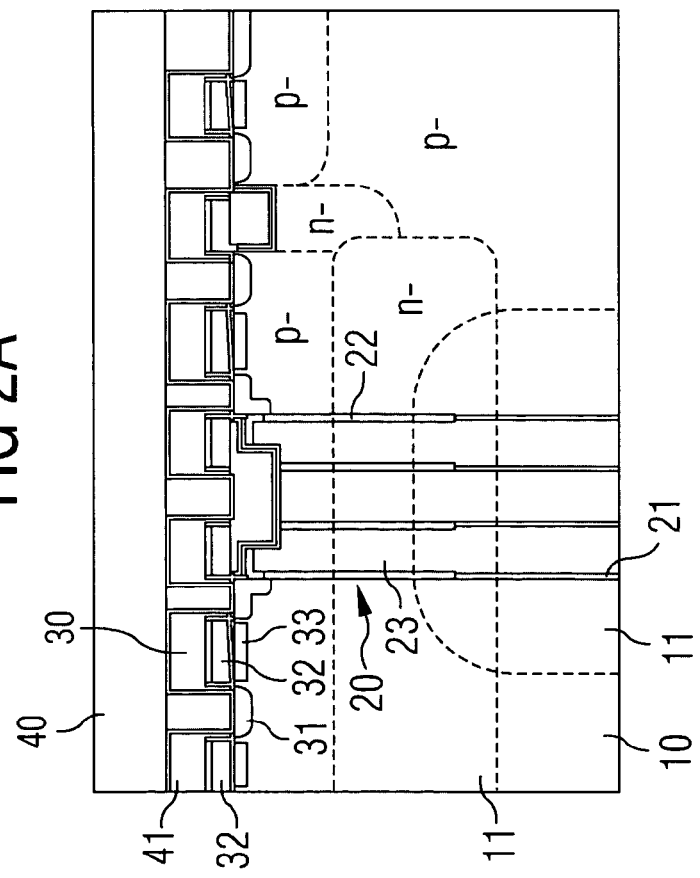

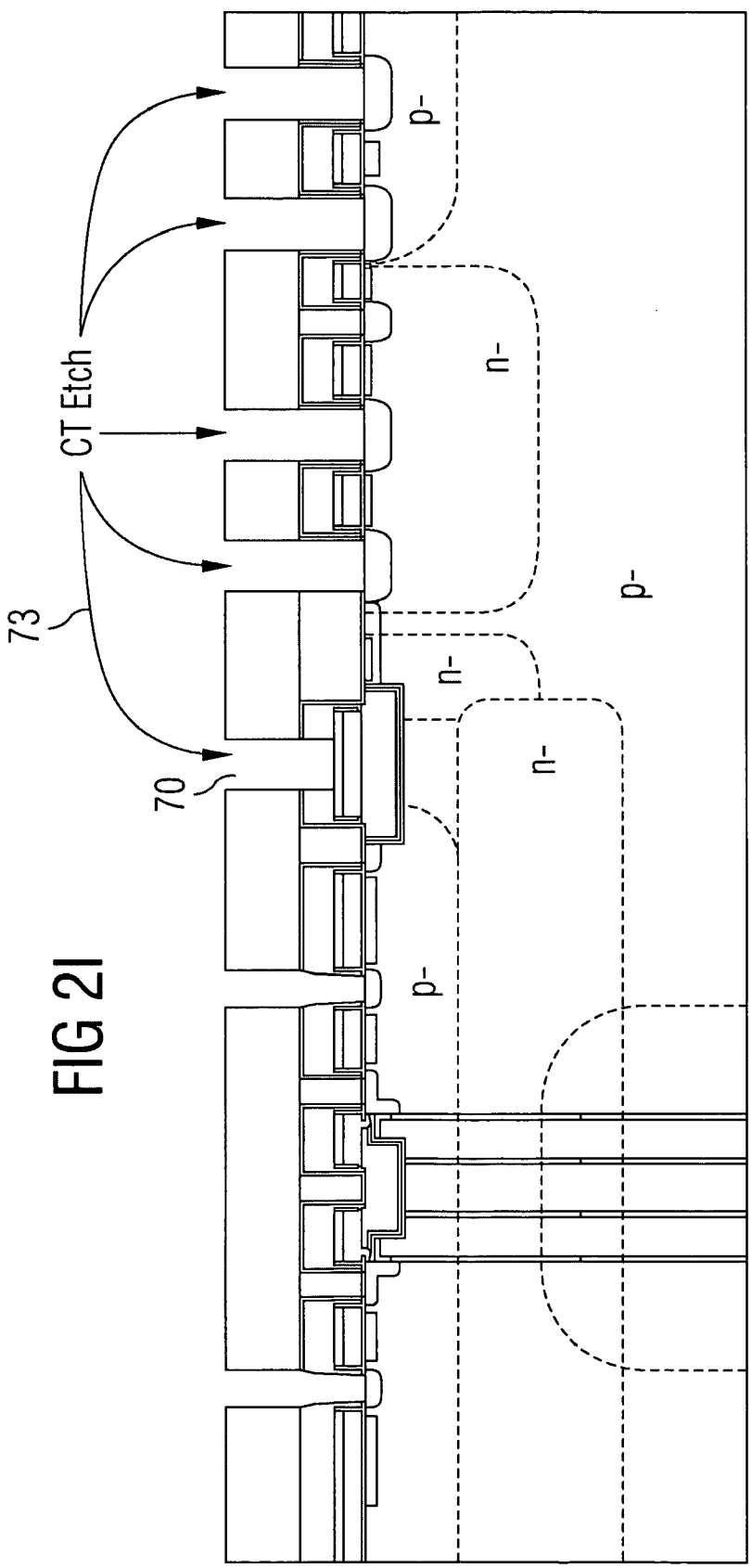

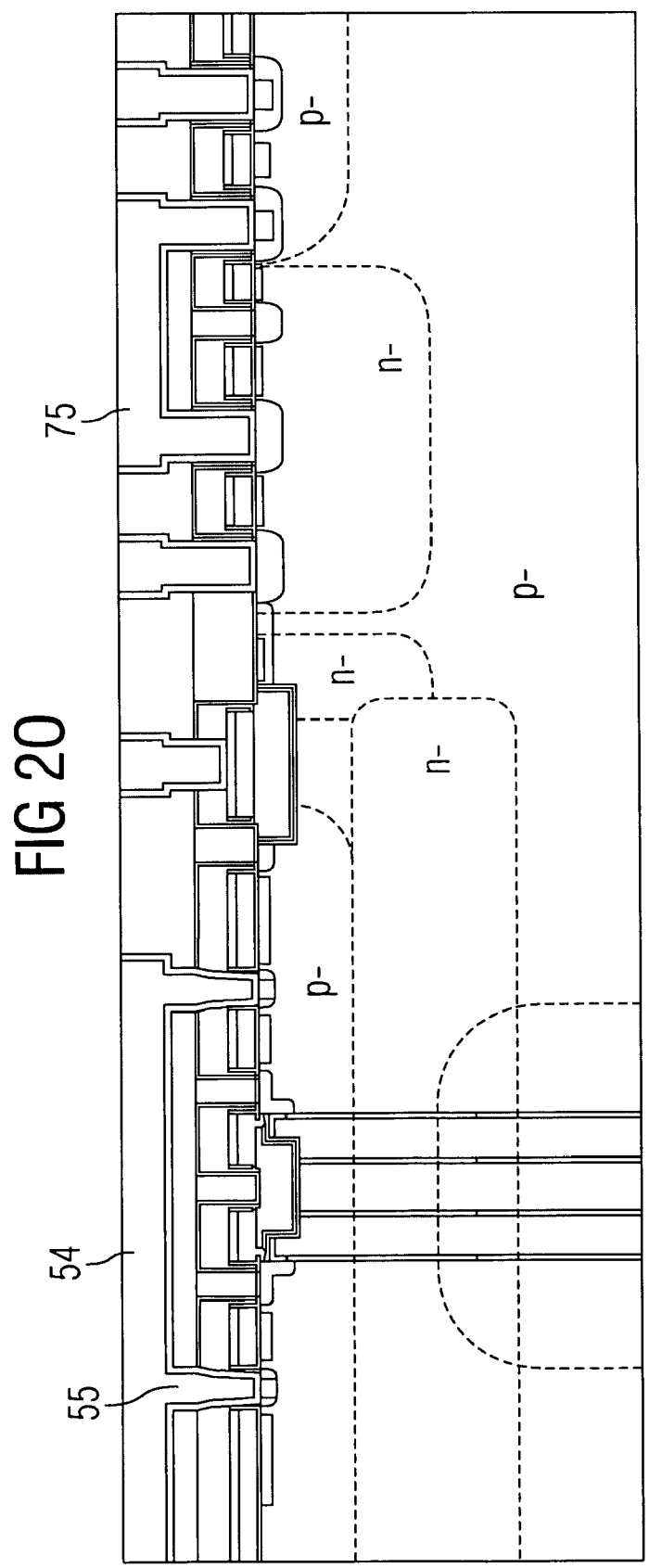

METHOD FOR FABRICATING METALLIC BIT-LINE CONTACTS

CROSS-REFERENCE TO RELATED APPLICATIONS

This application is a continuation of co-pending PCT patent application No. PCT/EP02/04308, filed Apr. 18, 2002, which claims the benefit of German patent application serial number 101 19 873.6 DE, filed Apr. 24, 2001. Each of the aforementioned related patent applications is herein incorporated by reference in their entireties.

BACKGROUND OF THE INVENTION

1. Field of the Invention

The invention relates to a method for fabricating metallic contacts, in particular bit-line contacts for an integrated circuit (IC), on a semiconductor wafer and to a memory cell having a metallic bit-line contact of this type, in particular for use in a dynamic random access memory (DRAM).

2. Description of the Related Art

Contact structures are formed in an insulator layer of a wafer with the aid of patterning methods and are then filled with a conducting material in order to make contact between electronic components in an integrated circuit (IC) on a semiconductor chip. Conducting material used are metals, metal alloys, doped semiconductors and electrically conductive organic substances. The various materials have different electrical properties. Contacts made from metals or metal alloys generally have the best electrical conductivity.

In dynamic memory chips, according to the current prior art, however, contact is made with semiconductor layers with the aid of metal contacts only at the peripheral substrate contacts in the peripheral circuit, and not in the memory cells themselves.

On account of the high integration density of DRAMs, bit-line contacts of the memory cells have very high aspect ratios with relatively small contact surface areas, which means that the introduction of uniform liner layers for the fabrication of metallic bit-line contacts is not practical in the memory cell array. However, liner layers of this type are required between the semiconductor substrate and the metal in order to prevent damage to the semiconductor substrate which may form during the deposition of the metal and the further heat treatment.

Furthermore, the structural elements which are defined directly in the region of the contact surface of a bit line react extremely sensitively to the process by which the bit-line contacts are fabricated. The doping of the semiconductor with foreign atoms, which is generally required when metals are used to make contact with semiconductor layers, in order to compensate for the different conduction band potentials of metal and semiconductor, causes considerable damage to the crystal lattice of the semiconductor substrate. This damage would impair the functioning of the memory cell and, in the worst possible scenario, would lead to the entire memory cell being destroyed.

In view of the above problems involved in the fabrication of metallic contacts, doped polysilicon, which does not require any particular matching to the semiconductor substrate and is particularly suitable for filling contact holes with a high aspect ratio, is customarily used to fill the bit-line contact holes.

In this fabrication method, which is referred to below as the polysilicon process, the bit-line structures are usually defined with the aid of the photolithography technique, in which first of all a photoresist layer is applied to the wafer surface, forming a mask for the subsequent etching of the insulator layer. Before deposition of a layer to fill the contact hole, the native oxide which collects in the contact hole as a constituent of the photolithographic layer has to be removed. The cleaning operation is usually carried out as wet chemical etching. The chemical substances used for this operation, in particular BHF, often also attack the insulator layer and lead to considerable widening of the defined contact hole structures, and consequently this process greatly increases the risk of short circuits between adjacent bit lines. To prevent these short circuits, therefore, the bit-line contacts are made smaller from the outset. However, this procedure considerable restricts the process window for etching of the bit-line contacts.

In the polysilicon process, the contact resistance of the bit-line contacts is determined to a very considerable extent by the doping of the polysilicon. In this process, the resistance of the bit-line contact can only be reduced by greater doping of the polysilicon, which in turn entails the risk of the dopant also diffusing out into the channel region of the select transistor, thus impairing functioning of the transistor. The risk of dopant diffusing out into the channel region also defines the minimum distance between the transistor electrodes and therefore limits the extent to which the bit-line contacts can be reduced in the polysilicon process.

U.S. Pat. No. 5,817,572 A, DE 199 52 273 A1 and U.S. Pat. No. 6,144,050 A have disclosed metallic contacts with a liner layer arranged between the metallic contact filling and an active region. On the other hand, DE 297 22 440 U1 discloses a semiconductor memory, the bit-line contacts of which have a metallic filling.

SUMMARY OF THE INVENTION

It is an object of the present invention to improve the procedure involved in fabrication of metallic bit-line contacts in integrated circuits, in particular for bit-line contacts in a memory cell array, and to provide a memory cell which is improved with regard to integration and performance.

This object is achieved by a method for fabricating a metallic bit-line contact on a semiconductor wafer in accordance with claim 1 and by a memory cell in accordance with claim 7. Preferred refinements are described in the dependent claims.

According to the invention, to fabricate a metallic bit-line contact, after the patterning of the bit-line contact hole and subsequent doping of the contact-hole region, first of all a heating step is carried out, in order to anneal the substrate damage caused by the doping, then a liner layer is produced on the semiconductor substrate, and finally the contact hole is filled with a metal or a metal alloy.

A significant advantage of the use of a metal or a metal alloy, in particular of tungsten, aluminum or copper, to fill the contact hole is that, given suitable doping of the semiconductor substrate in the contact-hole region, the result is a considerably lower contact resistance at the metal/semiconductor contact surface compared to the contact resistance at a polysilicon/semiconductor contact surface when the polysilicon process is used. This in turn, in the case of bit-line contacts for a dynamic random access memory (DRAM), results in a considerable increase in the saturation current of the associated select transistor.

It is also advantageous that, in the metallic bit-line contact according to the invention, compared to the polysilicon process the diffusion of dopant out into adjacent structural elements, in particular into the channel region of the select transistor, and therefore also the resulting disruption to the operation of the relevant structural elements, can be controlled significantly more successfully. The more favorable contact resistance of the metallic bit-line contact compared to the polysilicon-filled contact hole means that it is possible to reduce the dimensions of the integrated structures. Therefore, the method according to the invention can be used to achieve a higher integration density, in particular in DRAMs.

Another significant advantage of the invention is that, during production of the metallic bit-line contact, the cleaning step using BHF which in the polysilicon process is carried out after the photolithographic patterning of the contact hole, in order to remove the native oxide, can be made much shorter. As a result, the considerable widening of the contact hole as it occurs in the polysilicon process, and the risk of short circuits between adjacent contact lines which is associated with this widening, can be greatly reduced. Consequently, the reduced dimensions of the contact holes which are imposed on account of the widening of the contact holes during the polysilicon process, and the associated limitation to the process window during fabrication of the contact structures, are substantially avoided.

The production of a liner results in a barrier layer being produced between the filling of the bit-line contact hole and the semiconductor substrate, preventing the substrate damage which is customary during the metalization. The use of Ti or Ti/TiN as material for the liner layer, which is introduced as an intermediate layer between the semiconductor substrate and the metal filling of the contact hole, and the use of a sputtering process, a chemical vapor deposition (CVD) process or an atomic layer deposition (ALD) process, in the process according to the invention, allows uniform coating even of a contact hole with a high aspect ratio, in particular of a bit-line contact hole of a dynamic memory cell. In this way, it is reliably possible to prevent any damage in the semiconductor substrate which may have been caused by the metalization.

According to the invention, after doping of the semiconductor wafer has been carried out in the contact-hole region, the semiconductor substrate is heated in order to form the locally limited electrical contact layer. As a result, possible damage in the crystal lattice of the semiconductor substrate which is caused by the doping is annealed, so that there is no limitation to the functioning of the structures which are fabricated with the aid of the method according to the invention.

According to a preferred embodiment of the invention, the doping in the contact hole for the bit-line contact and the peripheral contacts of a memory cell takes place in a cell array using a mask in a joint process step, so that the inventive design of the bit-line contact as a metallic contact means that fewer process steps are needed compared to the polysilicon process used for the fabrication of a DRAM.

According to a further preferred embodiment of the invention, in which the patterning of the contact hole in the insulator layer on the semiconductor wafer takes place with the aid of the dual-damascene process, the separate step of cleaning the bit-line contact using BHF, which is generally required, can be eliminated altogether, with the result that undesired widening of the contact hole which could result from the cleaning process is completely avoided.

BRIEF DESCRIPTION OF THE DRAWINGS

The invention is explained in more detail with reference to the appended drawings, in which:

FIGS. 1A to 1E show a process sequence according to the invention for the fabrication of a metallic bit-line contact of a memory cell according to the invention for a DRAM.

DETAILED DESCRIPTION OF THE PREFERRED EMBODIMENT

The process sequence according to the invention for the fabrication of metallic bit-line contacts is illustrated with reference to the example of a bit-line contact for a memory cell in a dynamic random access memory (DRAM), the memory cell having a trench capacitor. However, within the context of the invention the process sequence according to the invention can also be applied to memory cells of other designs. It is also within the scope of the invention for the process presented above to be applied analogously to structures with complementary doping.

FIGS. 1A to 1E show cross sections through a semiconductor wafer during various process stages involved in the formation of the bit-line contact.

Figure 1A:
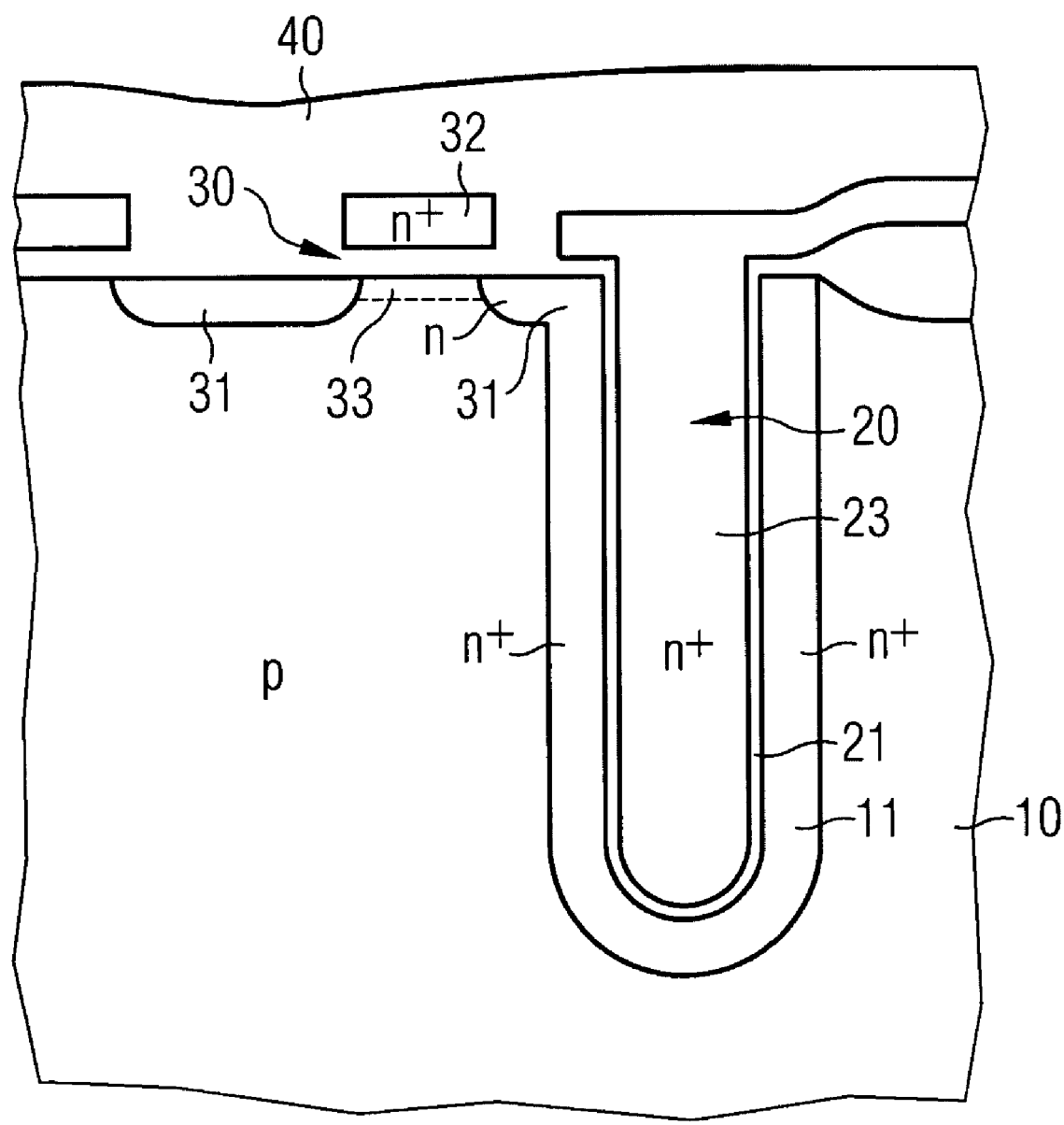

FIG. 1A shows a cross section through the dynamic memory cell before formation of the bit-line contact, on which cell structures have been produced during preceding process steps. The memory cell comprises a trench capacitor 20 and a select transistor 30, which is preferably produced with the aid of planar technology. The select transistor 30 comprises two n-doped diffusion regions 31 in a p-doped semiconductor substrate 10, which define the source/drain electrodes, and a highly n-doped region 32 above a channel 33 between the two n-doped diffusion regions 31, which region 32 is located within an insulator layer 40 and forms the gate electrode. The trench capacitor 20 is filled with a highly n-doped material 23 which forms the inner capacitor electrode. This electrode is separated from a likewise highly n-doped region 11 in the semiconductor substrate 10, which forms the outer electrode of the trench capacitor, by a thin film 21 with a high dielectric constant $\epsilon_r$.

To form an electrically conductive connection to one of the n-doped diffusion regions 31 of the select transistor 30, the outer electrode 11 of the trench capacitor 20 has an overlap with one of the n-doped diffusion regions 31 (i.e., the source/drain electrode of the select transistor 30).

To fabricate a contact between the source/drain electrode 31 of the select transistor 30 and a bit line, in a process step, a contact hole 50 (shown in FIG. 1B) is produced above the source/drain electrode 31 in the insulator layer 40 with the aid of a known photolithographic method. In a further process step, the native oxide in the etched contact hole 50 can be removed using one of the known methods. Alternatively, the contact hole 50 may also be produced with the aid of the dual-damascene process, in which case in principle it is advantageously possible to dispense with separate removal of the native oxide. FIG. 1B shows the cross section through the memory cell after production of the contact hole 50.

Figure 1C:
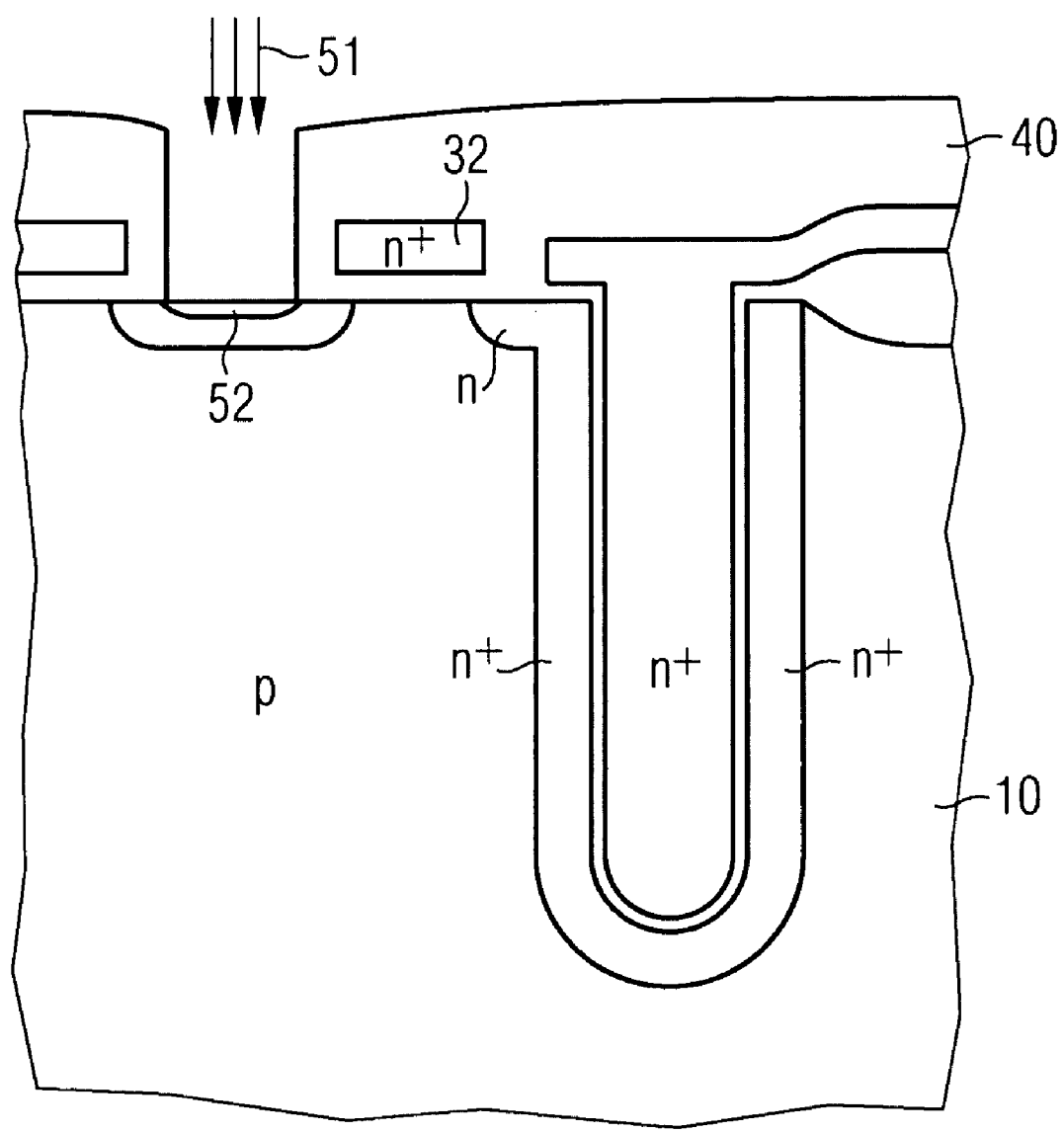

Then, in a further process step, as shown in FIG. 1C, a locally delimited contact layer 52 is produced in the substrate surface in the contact hole 50. For this purpose, the substrate surface which has been uncovered in the contact hole 50 is preferably bombarded with an ionized dopant 51. The highly doped region 52 which is produced by this process at the uncovered contact surface in the semiconductor substrate has a very minor lateral migration underneath the insulator layer 40 and therefore the gate electrode 32.

The damage to the solid-state lattice of the semiconductor surface which may be caused by the ion implantation in the contact-hole region 52 is then annealed by means of a heating step.

Alternatively, the locally limited contact layer 52 in the substrate surface in the contact hole 50 may also be produced using a different doping process, for example with the aid of a process which is based on the diffusion of a dopant. In an alternative doping process of this type, the heating step can be carried out with a short duration or at a lower temperature or can be eliminated altogether if the use of such a process means that there is no serious damage to the semiconductor substrate in the contact hole 50.

Figure 1D:
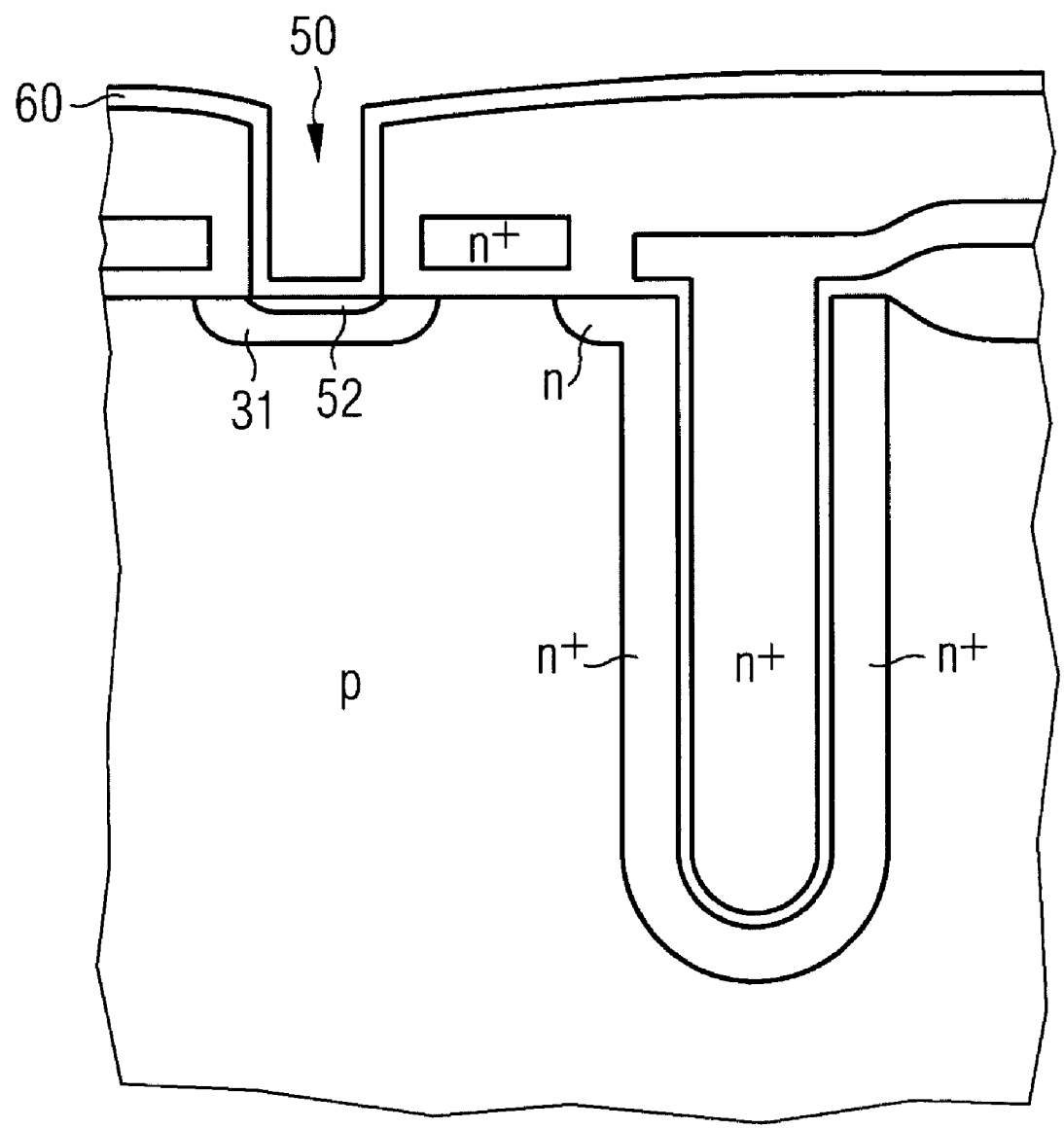

Then, in a further process step, a liner layer 60 is deposited in the contact hole 50 with the aid of a deposition method. In particular, a sputtering process is used for this purpose, reliably resulting in sufficient bottom coverage in the contact hole. The liner layer 60 prevents harmful chemical reactions which may occur when certain metals are used as part of metalization of the contact hole 50 in the diffusion region 52. In this case, it is preferable to use a liner layer 60 made from a metal, in particular Ti or Ti/TiN, or a metal alloy. To achieve a favorable contact resistance with respect to the substrate and to obtain an effective barrier against damage to the substrate during the deposition of metal, the liner layer 60 which has been deposited may also be heated during the further course of the process. FIG. 1D shows the memory cell after deposition of the liner layer 60.

To produce an electrically conductive connection between a bit line and the diffusion region 31 of the select transistor 30, the contact hole 50 is filled with a metal or a metal alloy, in this case preferably tungsten, aluminum or copper, as shown in FIG. 1E, with the aid of a known deposition method. The bit-line metalization is preferably carried out at the same time as the filling of the peripheral contact holes. Then, a known cleaning step is carried out for the purpose of eliminating the residues of material and planarizing the surface.

The above-described exemplary embodiment of the method according to the invention uses a metal or a metal alloy to fill the bit-line contact hole 50. The bit-line contact 55 which is fabricated by means of this method has a considerably lower contact resistance than a bit-line contact which is filled with polysilicon. As a result, compared to the polysilicon-filled contact, it is possible to considerably increase the saturation current of the select transistor 30. Since the cleaning step using BHF which is required is also considerably shorter compared to the polysilicon process, there is only slight widening of the bit-line contact hole 50 in the fabrication process described above, with the result that the risk of short circuits between two adjacent bit-line contacts 55 is considerably reduced.

A further process sequence according to the invention for fabricating metallic bit-line contacts according to the invention is explained with reference to the example of a 256 Mbit DRAM with the aid of the dual-damascene process.

Figure 2D:
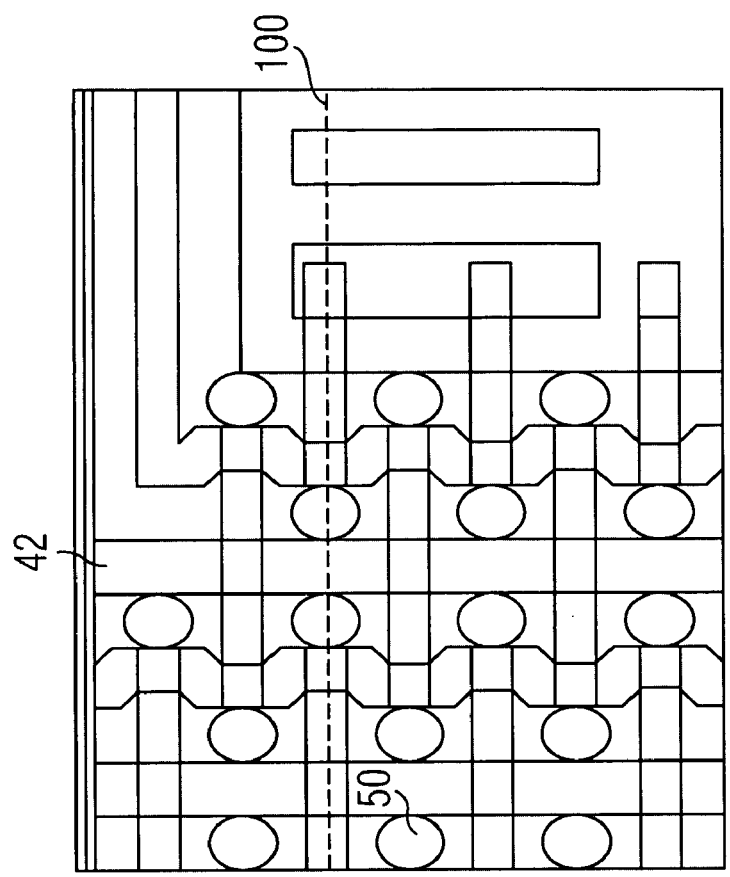
FIGS. 2A to 2O show a further process sequence according to the invention for the fabrication of metallic bit-line contacts for a 256 Mbit DRAM.

FIGS. 2A, 2C, 2E, 2G and 2I to 2K, as well as 2M to 2O show a cross section through a silicon wafer 10 having a trench capacitor 20 and a select transistor 30 during various process stages involved in the formation of a bit-line contact and further peripheral contacts. Furthermore, to illustrate the individual process steps, the views of the patterned surface are illustrated in FIGS. 2B, 2D, 2F, 2H and 2L, showing the section plane on line 100 in the preceding figures. During the process sequence which is shown in FIGS. 2A to 2O, tungsten is used as metal for filling the interconnects and the contact holes.

FIG. 2A shows the silicon wafer 10, which is weakly p-doped, and has a buried n-doped region 11, as well as further n-doped and p-doped wells (not described in more detail) which have been produced in previous process steps. Two trench capacitors 20 and further peripheral structures have also been formed in this silicon wafer 10 from previous process steps. Each trench capacitor 20 is filled with arsenic-doped polysilicon 23 which forms the inner electrode of the trench capacitor.

In a lower part of the trench, this electrode has a nitride layer 21 with a high dielectric constant $\epsilon r$, and in an upper region 22 of the trench, this electrode has an $SiO_2$ layer with a lower dielectric constant $\epsilon r'$, separating the electrode from the higher n-doped region 11 in the semiconductor substrate 10. This highly n-doped region 11 forms the outer electrode of the trench capacitor 20. A layer of phosphorus-doped polysilicon is formed in the upper region 22 of the trench in order to make contact between a trench capacitor 20 and the respective select transistor 30.

Two select transistors 30 are formed directly adjacent to the two capacitors 20. Each of the two select transistors 30 has two highly n-doped diffusion regions 31 which serve as current-delivering electrode (source) and current-consuming electrode (drain). Above a channel region between the two electrodes 31 there is a control electrode (gate) 32, which is embedded in an insulator layer 41, preferably consisting of $Si_3N_4$, and which preferably consists of phosphorus-doped polysilicon and is insulated from the channel region by a further electrically nonconductive layer. When the memory cell is operating, the gate electrode 32 generates an electric field in the p-channel region and opens up a conduction channel 33 for the operation of reading and writing the trench capacitor 20.

The memory cell shown in FIG. 2A has still further structures which originate from the previous process steps and are not essential to the invention, for which reason they are not dealt with in more detail in the present description. The surface of the memory cell is also covered by an insulating layer 40, which preferably consists of $SiO_2$ and has been produced in an earlier process step using a TEOS vapor deposition process and a subsequent heating step. FIG. 2B shows a plan view of the unpatterned insulator layer 40.

Figure 2C:
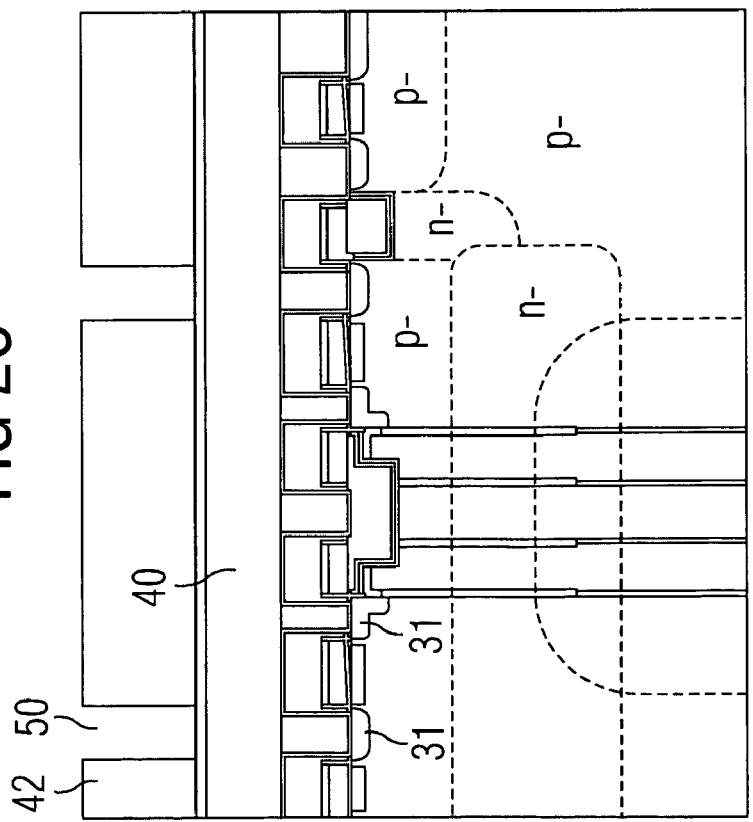

To form a conductive connection between the n-doped electrodes 31 of the select transistors 30 and a bit line, as shown in FIG. 2C, in a first process step contact holes for the bit-line contacts are defined with the aid of the lithography technique. For this purpose, a layer of photoresist 42 is applied to the insulator layer 40 and is subsequently exposed and then developed using a photolithography mask (not shown here). FIG. 2D shows a plan view of the patterned photoresist layer 42 including the structures for the bit-line contact points 53 of the memory cell.

The patterning of the insulator layer 40, 41 to form the contact hole structures is carried out with the aid of the dual-damascene process. In this process, first of all the uppermost insulator layer 40 is patterned with the aid of a conventional wet etching process. The structures which are produced during this process are then used as mask for the further wet etching of the lower insulator layer 41. The use of the dual-damascene technique for patterning of the contact holes in the exemplary embodiment which is presented here completely eliminates the cleaning of the contact hole with BHF which is generally required after lithographic patterning.

Figure 2F:
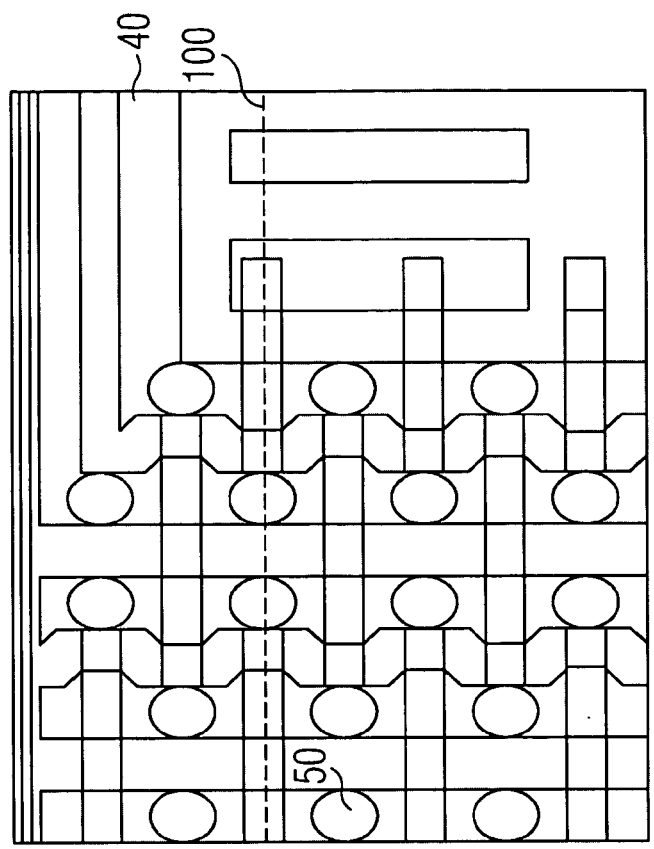
Figure 2E:
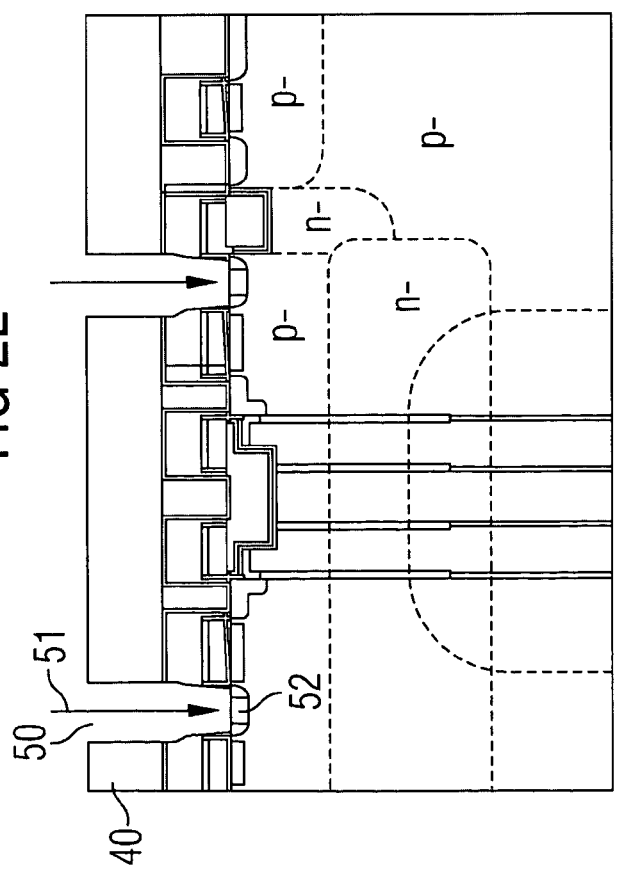

As shown in FIG. 2E, ion implantation is then carried out in the substrate surfaces of the contact holes 50 which have been uncovered with the aid of the lithography step. In the process, accelerated arsenic ions 51 are bombarded onto the semiconductor surface of the contact holes. The regions 52 of the semiconductor surface which are formed in this way are highly doped with arsenic and form the contact layer for the metalization of the bit-line contacts 50 which follows as the process continues. Alternatively, the ion implantation can also be carried out using phosphorus ions. FIG. 2F shows a plan view of the patterned insulator layer 40 with the holes (50) for the bit-line contacts of the memory cells.

Figure 2H:
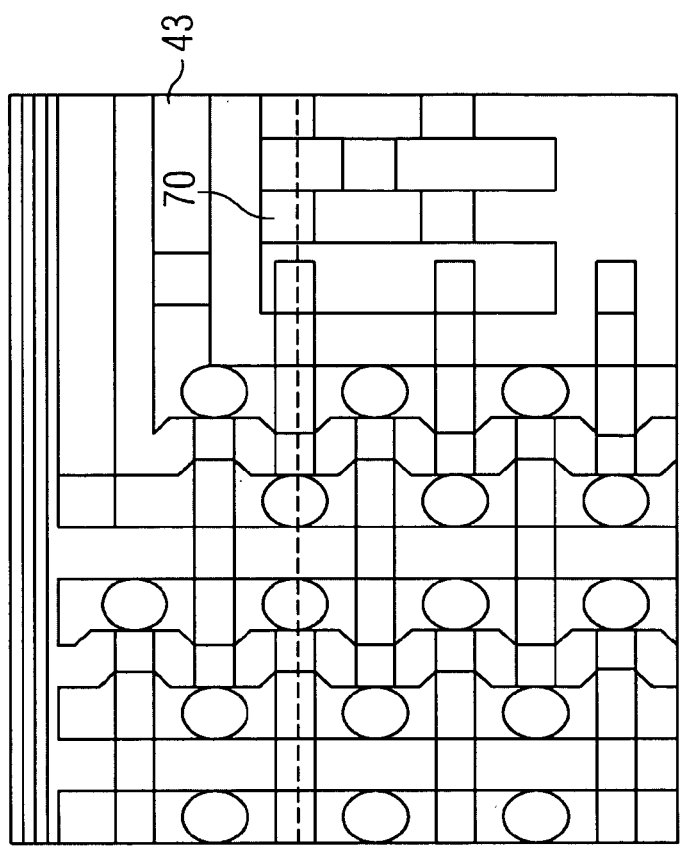
Figure 2G:
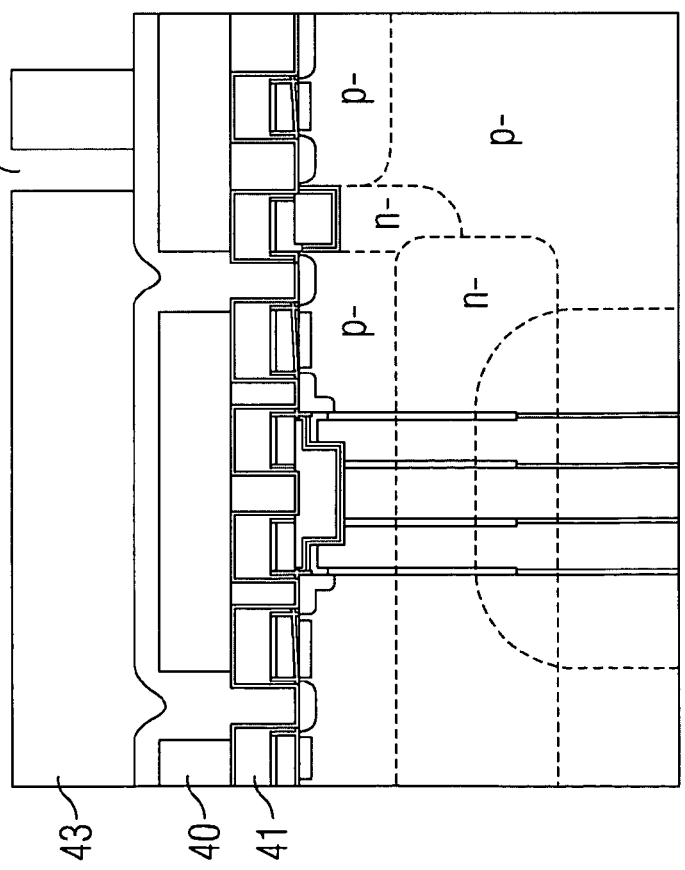

Then, in the following process steps, lithographic patterning of the two insulator layers 40, 41 is carried out once again in order to produce contact holes 70 in the periphery of the memory cell array. For this purpose, as shown in FIG. 2G, a layer of photoresist 43 is applied to the surface, then exposed using a mask and developed using a standard process. As shown in FIG. 2I, the structures are produced with the aid of a plasma-etching process 73. The photoresist 43 is then removed from the surface in the same way as in the first lithography step. FIG. 2H shows a plan view of the patterned photoresist layer 45 with contact holes 70 in the peripheral structures of the memory cells.

Figure 2J:
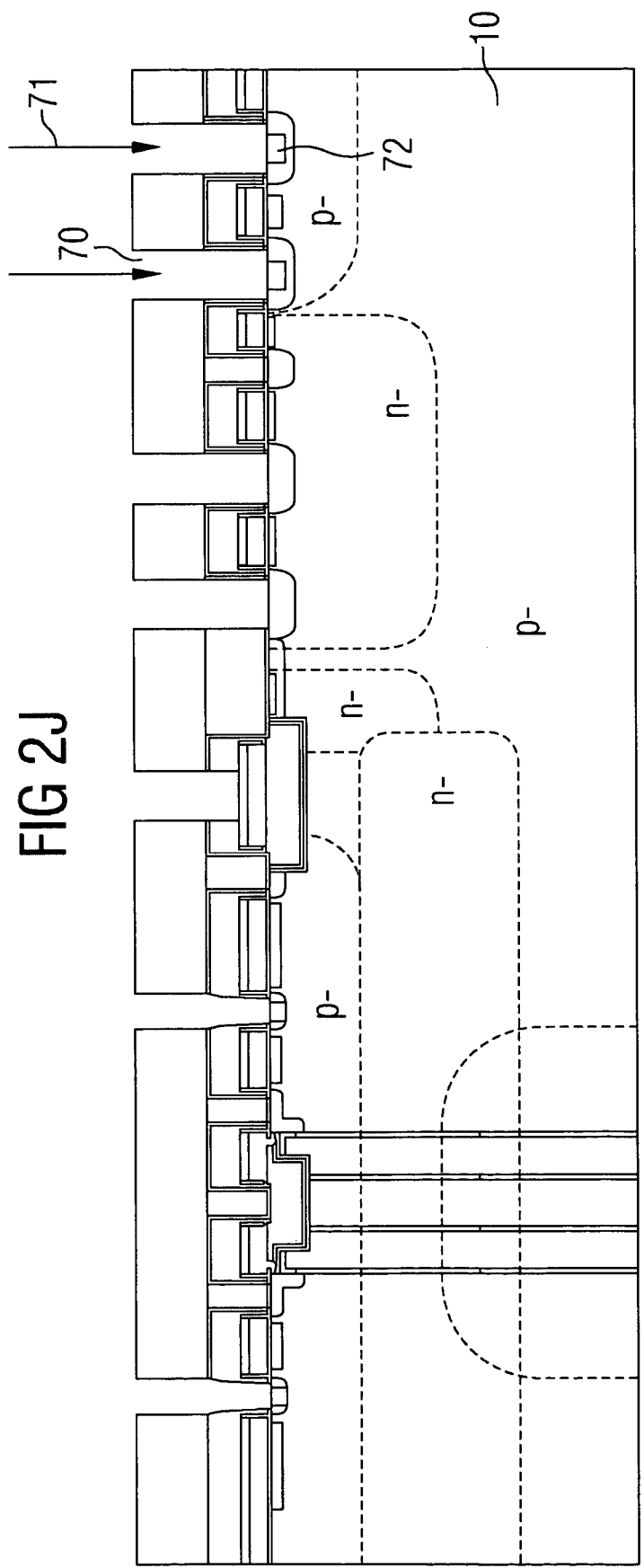

FIG. 2J shows further ion implantation 71 on that substrate surface of the peripheral structures which has been uncovered by the previous lithographic patterning. In the process, during the first step a special photoresist (not shown here) which is suitable for the ions used is applied to the surface and developed. The subsequent implantation of arsenic ions 71 takes place only in those regions of the peripheral contact structures which are not covered by the photoresist. The regions 72 in the semiconductor substrate 10 which have been prepared in this way therefore have a contact layer with a high doping of arsenic.

After the photoresist has been removed, wet-cleaning steps are carried out using the Piranha and the Huang/Megasonic method. Alternatively, the two implantation processes 51, 71 which are illustrated in FIGS. 2E and 2J can be carried out with the aid of a modified mask in a joint process step.

Next, a heat treatment of the implantation regions 52, 72 is carried out. This results in annealing of any damage in the semiconductor substrate 10 in the contact-hole regions which has been caused by the ion implantations.

Figure 2K:
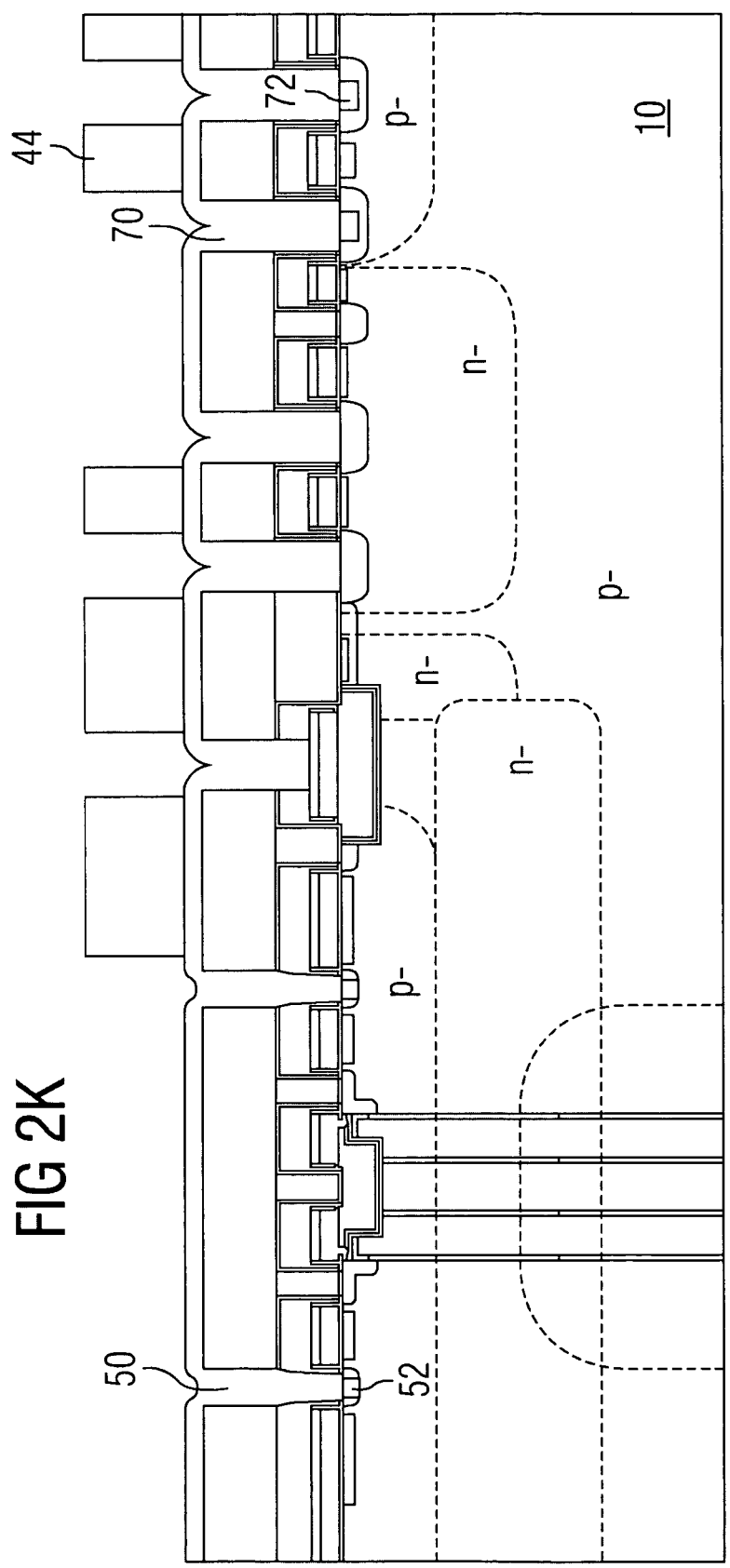
Figure 2L:
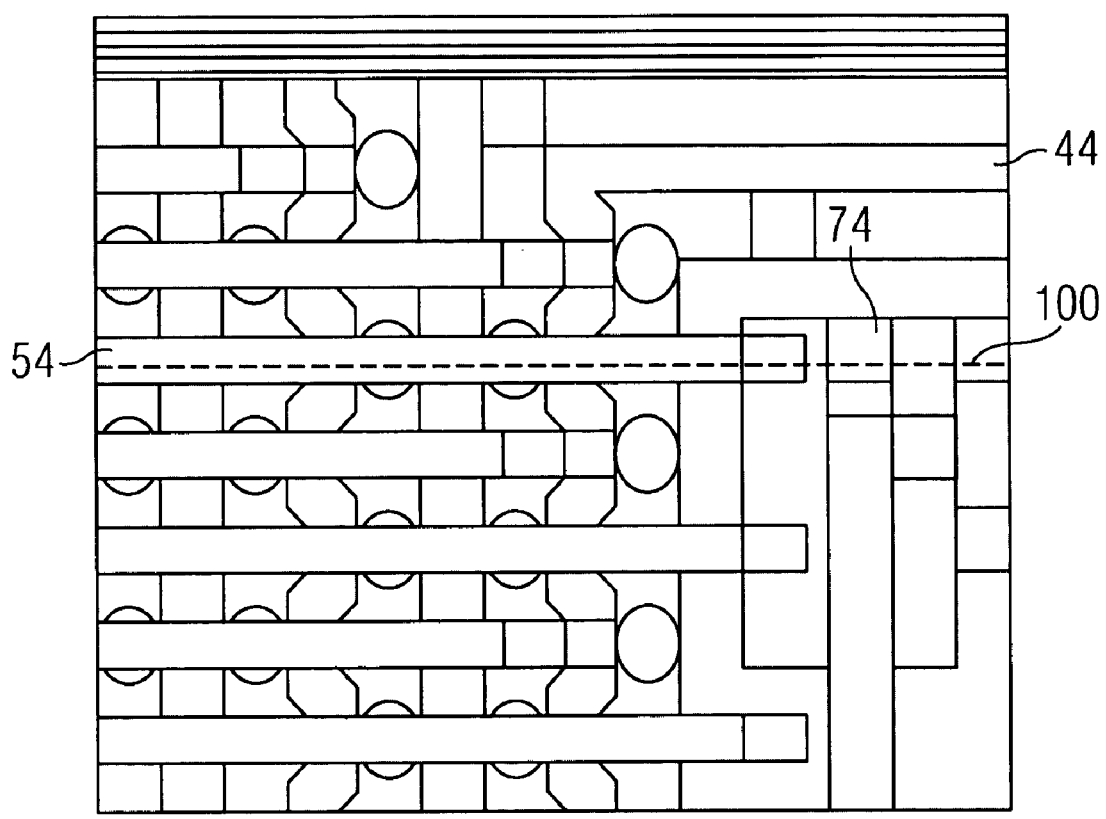

In a following process step, the interconnects which are required for making contact between the bit-line contact holes 50 of the memory cell and the contact holes 70 in the peripheral structures are fabricated by photolithography. In the process, as shown in FIG. 2K, the surface of the wafer is covered with a photoresist layer 44, and exposed and developed through a mask. FIG. 2L shows a plan view of the patterned photoresist layer 44 with the bit-line tracks 54 and further conduction tracks 74 in the periphery of the memory cells.

Figure 2M:
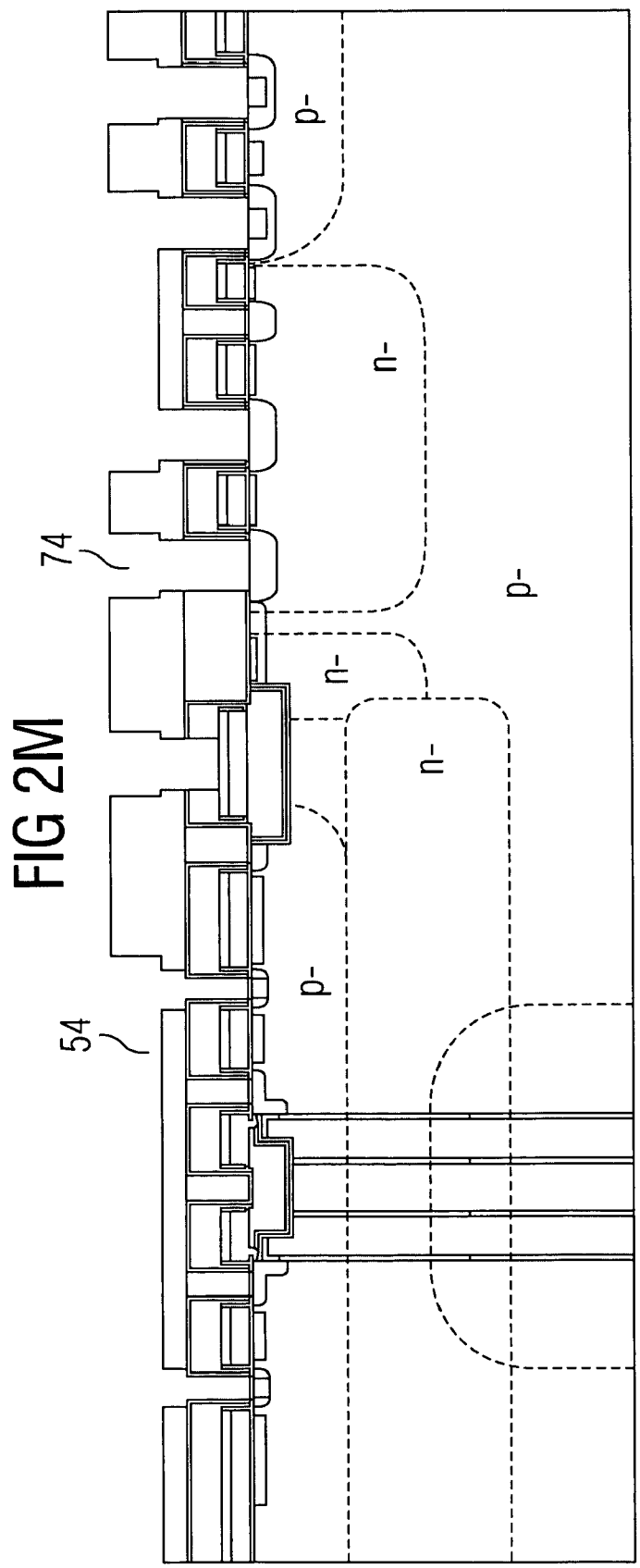

FIG. 2M shows the structures which are then formed by plasma etching in the insulator layer 40 for the bit-line tracks 54 and further interconnects 74 in the peripheral structures of the memory cell array after removal of the photoresist 44 and subsequent wet cleaning of the surface with the aid of the Piranha method.

Figure 2N:
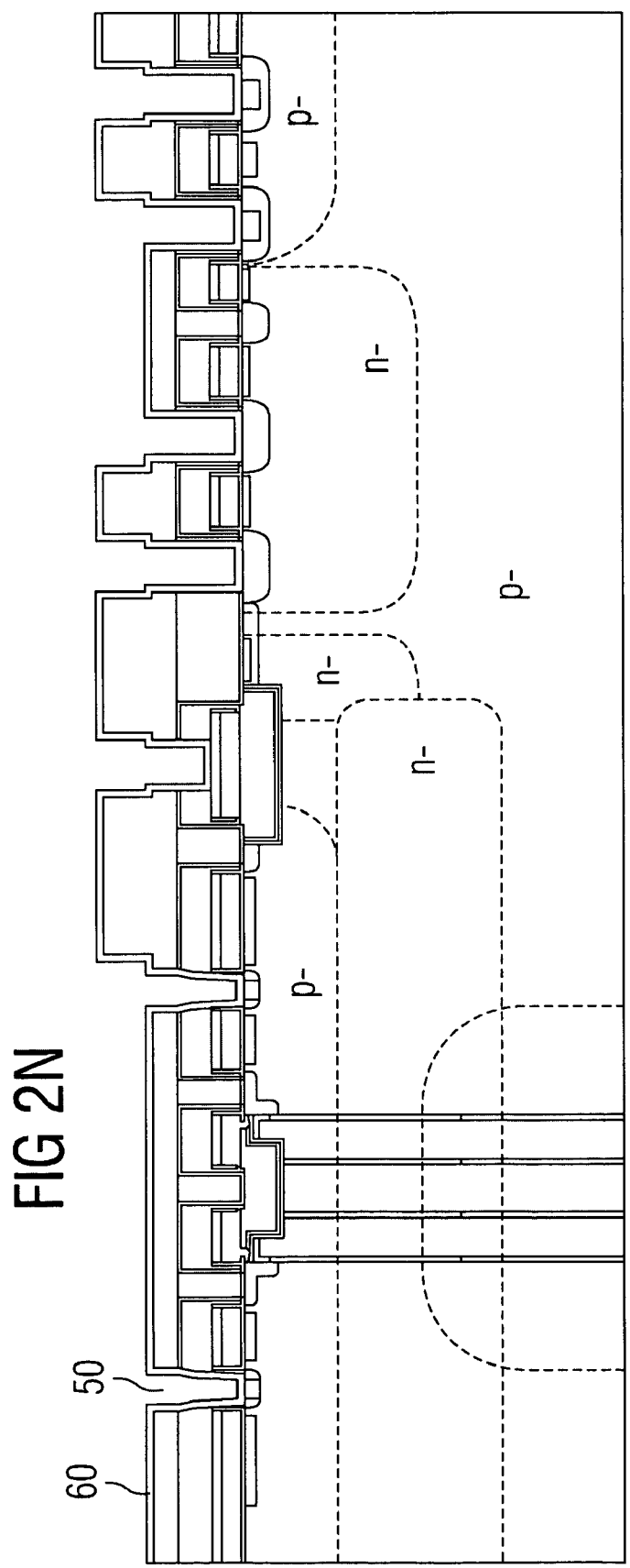

FIG. 2N shows a cross section through the wafer surface after removal of the native oxide in the contact holes and subsequent deposition of a liner layer 60. In the process, a metal, which in the exemplary embodiment illustrated is titanium, has been applied to the surface of the wafer with the aid of a sputtering process, ensuring sufficient bottom coverage. To achieve a favorable contact resistance with respect to the substrate and to obtain an effective barrier with respect to damage to the substrate during the deposition of metal, the liner layer 60 is heated in a subsequent process step.

FIG. 2O shows the wafer after the bit-line contacting 55 has been executed. For this purpose, tungsten has been deposited on the surface of the wafer using the modified chemical vapor deposition (MCVD) process and has then been planarized by means of chemical mechanical polishing in such a manner that the metal is then only present in the deeper structures of the bit lines 54, 55 and of the peripheral contacts 74, 75. In the final step of the process sequence illustrated here, wet cleaning of the wafer surface is carried out in order to eliminate polishing residues.

In the exemplary embodiment of the process according to the invention which has been explained above, the dual-damascene technique is used for fabrication of the bit-line contacts 55. In this case, the removal of the native oxide in the contact hole using BHF, which is required in the polysilicon process, can be eliminated altogether. Therefore, the bit-line contact holes 50 are not widened, unlike in the polysilicon process, so that the risk of short circuits between adjacent bit-line contacts 55 is minimized.

In the process which has been explained, the same metal, in this case preferably tungsten, is used to fill the contact holes for the bit-line contacts and for the peripheral contacts, with the result that the entire metalization can be carried out in a single process step, unlike the polysilicon process, in which the filling of the bit-line contact holes with doped polysilicon requires a further process step.

The bit-line contact 55 which is fabricated in accordance with the exemplary embodiment presented above has a considerably lower resistance than a bit-line contact fabricated using the polysilicon process. Since in a bit-line contact 55 which is fabricated using the inventive method explained above there is no serious diffusion of a dopant out of the bit-line contact 55 into the channel region 22 of the select transistor 20, as occurs in the polysilicon process, this method can be used to achieve considerably shorter distances between the electrodes 31 and therefore also overall a higher integration density of the DRAM.

While the foregoing is directed to embodiments of the present invention, other and further embodiments of the invention may be devised without departing from the basic scope thereof, and the scope thereof is determined by the claims that follow.

What is claimed is:
1. A memory cell formed on a substrate, comprising:
a trench capacitor; and
a select transistor, comprising:
    a diffusion region forming a source/drain electrode of the select transistor;
    a bit-line contact formed in an insulator layer and comprising a filling comprising at least one of a metal and a metal alloy, wherein the bit-line contact connects the source/drain electrode to an associated bit line; and
    a doped region formed within the source/drain electrode, wherein the doped region is completely surrounded by the source/drain electrode except for a surface to contact the filling of the bit-line contact, at least a portion of the source/drain electrode disposed between the doped region and the substrate preventing contact between the doped region and the substrate, the doped region comprising a locally limited electrically conductive contact layer which is formed substantially underneath the bit-line contact in the diffusion region and which has substantially no lateral migration underneath the insulator layer adjoining the bit-line contact.

2. The memory cell of claim 1, wherein the select transistor is at least partially disposed in the substrate and the trench capacitor is completely disposed in the semiconductor substrate.

3. The memory cell of claim 1, wherein the bit-line contact comprises at least one of tungsten, aluminum and copper.

4. The memory cell of claim 1, wherein the memory cell is part of a memory cell arrangement comprising peripheral contacts formed in a same structure plane and comprising a filling substantially similar to that of the bit-line contact.

5. The memory cell of claim 1, the bit-line contact further comprising a liner layer formed between the substrate and the filling of the bit-line contact.

6. The memory cell of claim 5, wherein the liner layer comprises at least one of Ti and Ti/TiN.

7. A memory cell formed on a substrate, comprising:
a trench capacitor; and
a select transistor, comprising:
   a diffusion region forming a source/drain electrode of the select transistor;
   a bit-line contact formed in an insulator layer and comprising a filling comprising at least one of a metal and a metal alloy, wherein the bit-line contact connects the source/drain electrode to an associated bit line;
   a doped region formed within the source/drain electrode between the substrate and the filling of the bit-line contact, wherein the doped region is completely surrounded by the source/drain electrode except for a surface to contact the filling of the bit-line contact, at least a portion of the source/drain electrode disposed between the doped region and the substrate preventing contact between the doped region and the substrate, the doped region comprising a locally limited electrically conductive contact layer which is formed substantially underneath the bit-line contact in the diffusion region and which has substantially no lateral migration underneath the insulator layer adjoining the bit-line contact; and
   an annealed region formed as a result of an anneal process performed during fabrication of the bit-line contact.

8. The memory cell of claim 7, wherein the annealed region includes a damaged region damaged during a doping processed performed to form the doped region.

9. The memory cell of claim 7, wherein the annealed region includes at least a portion of the doped region.

10. The memory cell of claim 7, the bit-line contact further comprising a liner layer formed between the substrate and the filling of the bit-line contact.

11. The memory cell of claim 10, wherein the liner layer comprises at least one of Ti and Ti/TiN.

12. The memory cell of claim 7, wherein another source/drain electrode of the select transistor is connected to an electrode of the trench capacitor which is completely disposed in the substrate.

* * * * *